United States Patent [19]
Kikinis

[11] Patent Number: 5,940,588
[45] Date of Patent: Aug. 17, 1999

[54] PARALLEL TESTING OF CPU CACHE AND INSTRUCTION UNITS

[76] Inventor: Dan Kikinis, 20264 Ljepava Dr., Saratoga, Calif. 95070

[21] Appl. No.: 08/685,041

[22] Filed: Jul. 23, 1996

Related U.S. Application Data

[63] Continuation of application No. 08/491,157, Jun. 16, 1995, Pat. No. 5,539,878.

[51] Int. Cl.⁶ .............................. G06F 11/00; G06F 11/30
[52] U.S. Cl. ............................... 395/183.04; 395/183.06; 395/183.18; 371/21.1; 371/22.1
[58] Field of Search ......................... 395/183.04, 183.06, 395/183.18, 183.16, 183.07; 371/21.1, 22.1

[56] References Cited

U.S. PATENT DOCUMENTS

| | | | |
|---|---|---|---|
| 4,553,201 | 11/1985 | Pollaek, Jr. | 364/200 |
| 4,891,811 | 1/1990 | Ash et al. | 371/21.2 |
| 5,055,774 | 10/1991 | Catt | 324/158 R |
| 5,155,844 | 10/1992 | Cheng et al. | 395/183.18 |
| 5,398,325 | 3/1995 | Chang et al. | 395/425 |
| 5,479,413 | 12/1995 | Sicola et al. | 371/21.1 |
| 5,539,878 | 7/1996 | Kikinis | 395/183.06 |

Primary Examiner—Hoa T. Nguyen
Attorney, Agent, or Firm—Donald R Boys

[57] ABSTRACT

A method for testing CPU microprocessors having internal cache involves testing one IU and a portion of the internal cache, then loading a cache test routine to the tested portion of internal cache and causing that routine to be executed by the tested IU to test the previously untested portion of the internal cache while simultaneously testing any other IUs and circuitry on the CPU microprocessor. A system is disclosed for performing the method.

7 Claims, 4 Drawing Sheets

PARALLEL TESTING OF CPU CACHE AND INSTRUCTION UNITS

This application is a continuation of application Ser. No. 491,157 filed Jun. 16, 1995 now U.S. Pat. No. 5,539,878.

FIELD OF THE INVENTION

The present invention is in the area of testing IC circuits, and pertains more particularly to testing of microprocessors used as CPUs for computer systems.

BACKGROUND OF THE INVENTION

Microprocessors are highly complex integrated circuits (ICs) developed primarily for performing logic and arithmetic functions at extremely high speeds, as is well-known in the art. Many sorts of microprocessors have been developed for many specialized purposes, but perhaps the most complex of all microprocessors are those produced to serve as Central Processing Units (CPUs) for such as personal computers.

Early CPU, microprocessors were essentially high-performance calculators with circuitry for fetching instructions and data from electronic storage, and for outputting results of calculations and the like. However, with increasing demand for performance, CPUs have evolved at the time of this patent application to include on-board temporary memory, known as internal cache or Level 1 cache, for storing data and commands pre-fetched for processing by the CPU. Some CPUs have separate internal cache structures dedicated to data and commands, and in some CPUs data a commands are stored in the same internal cache. In addition to internal cache, many high-performance CPUs now comprise separate instruction units (IUs) designed to be optimally efficient at certain kinds of operations.

The Intel family of i486™ microprocessor CPUs is a good example of the highly complex CPUs described above. The various models of CPUs belonging to this product family are described in detail in the product bulletin "Intel486™ Processor Family", Copyright 1994 by Intel Corporation of Santa Clara, Calif. This book can be ordered under Order Number 242202-001 from Intel, and is incorporated in the present patent application by reference.

Partly because of the high order of complexity described for such CPUs, it is vitally important that each and every transistor and connection for every device and circuit be tested and verified. Any failure in the millions of transistors and connections making up a CPU may at some point be catastrophic. Thorough testing of every component is then absolutely critical, and the device level testing that is necessary has become a larger and larger component of the overall cost of producing such CPUs.

As is well-known in the art, microprocessor CPUs, as with other integrated circuits, are produced by alternating additive and subtractive thin-film techniques on substrates of semiconducting material, commonly doped silicon wafers. At the end of the wafer-based processing, individual chips are separated from wafers, typically by techniques of high-precision diamond sawing.

An individual CPU microprocessor, like most other ICs, is a relatively small, usually rectangular chip having in some cases millions of discrete transistors and miles of interconnecting electrically-conductive traces. The traces are ultimately connected to conductive pads around the periphery or usually one side of the chip. These are the contacts from outside the chip to the internal circuitry of the chip.

Typically individual chips, at this stage called dies, are mounted to die attach pads in lead frames, fine wires are bonded to the conductive pads around the periphery of each die and adjacent electrical leads, and the individual dies are enclosed in a molds and encapsulated, or welded shut into ceramic carriers, as is well-known in the art, with leads protruding, after trimming, for eventual attachment to pads on a printed circuit board (PCB). In the case of a microprocessor CPU, the PCB may be what is termed in the art a motherboard.

CPUs may be tested either before or after incorporation into packages, as described above. The earlier in the manufacturing process that testing can be done, the better, in most cases, because failures can be rejected early, avoiding expensive subsequent manufacturing steps. Techniques are rapidly being developed for handling and testing CPU chips before the packaging stage, which offers considerable savings. Many CPUs, however, are still tested after encapsulation, because alignment and automatic handling is less critical after packaging.

In the testing process, a packaged CPU is mounted to or into a test socket, which provides connection of each lead to circuitry of a specialized printed circuit board, which leads to computerized testing circuitry in a test machine. In the case of pre-package testing, contacts from a testing apparatus are brought to wire bonding pads on individual dies, in some cases before the dies are separated from a silicon wafer on which they are produced. With contact to testing equipment thus made, each input and output to a CPU can be manipulated, and, through predeveloped software, each transistor and connection of a CPU man be exercised and tested.

Testing individual transistors of a CPU microprocessor is not like testing a large number of individual switches, wherein one might simply activate each switch in turn and test the output for voltage. The interconnect traces on a CPU microprocessor are so small (in some cases on the order of one micron in width), and so close together, that making contact to test individual transistors as one would test devices on a printed circuit board is simply not possible. Many traces, in fact, are buried in the topography of the chip.

Different CPUs in the Intel 486™ CPU family have different package designs and pinouts. In various models there are, for example, a 168-pin pin grid array (PGA), a 208-lead SQFP Quad Flat Pack, and a 196-lead PQFP Plastic Quad Flat Pack.

The process of thoroughly testing a CPU is a processss conventionally of applying vectors to the pin, pad, or lead array of the CPU, depending on the point in production at which the CPU is tested, and sensing resulting output vectors, a vector being a pattern of logical ones and zeros pertaining to the entire lead or pin array. For a 168-pin PGA, for example, a vector may be a 168-bit pattern. Once a vector is applied a CPU will typically respond with an output vector (bit pattern). which may be compared with a result expected.

In design of a CPU, test vectors are developed for thorough testing. Conventionally a CPU to be tested is mounted or interfaced, as described briefly above, with contact from the pins, pads, or leads to and through a test board to a computerized testing apparatus. The computerized testing apparatus executing specially prepared testing software, rapidly applies test vectors and reads responses sequentially until all of the transistors and connections of the test-object CPU are verified. If, at any point in the testing process responses are inappropriate for a properly operating CPU, the testing apparatus can take appropriate action, depending on the nature of the apparatus. CPUs to be tested, for example, are typically numbered or otherwise identified, so a testing apparatus can list the number of the CPU and associate with that number the point in the test at which failure was encountered.

The testing process, by virtue of the number of individual circuits and transistors in a CPU, can be a long and involved process, requiring duplication of expensive testing equipment to provide a suitable chip testing rate. Moreover, by virtue of the many mounts and contacts that have to be made, false failures may often be encountered. That is, a test meant to verify a particular transistor may indicate a failed transistor by virtue of a poor contact between a lead and a socket pad, or by virtue of a long electrical path with high inductance, even though the CPU is actually not faulty at all.

Inclusion of relatively large amounts of internal cache memory on CPUs has made the testing process even more critical and time consuming. The Intel 486™, family, for example, depending on model, has internal cache of either 8 kByte or 16 kByte. As the size of internal cache increases, the number of vectors needed to completely test the memory grows exponentially, consuming correspondingly greater test resources. In the Intel 486™ family of CPUs provision is made in some instances to test internal cache memory on-chip. Chapter 11.0 of the handbook referenced above. "Intel 486™ Processor Family". is devoted to Built-in self test (BIST). This ability, however, is exclusive, and other testing of chip elements and connections cannot be made while the BIST mode is operating.

To reduce the expense of CPU testing and to simultaneously increase reliability what is needed is hardware and, or firmware incorporated in the CPU to be tested, together with unique test vectors to be presented by a computerized testing apparatus, whereby the test-object CPU, after conventional testing of a single IU and a portion of internal cache, may be utilized through the tested IU to test the remainder of internal cache in parallel with testing of other IUs. Doing these operation in parallel can reduce overall testing time for some CPUs by half, providing considerable savings in the testing process.

SUMMARY OF THE INVENTION

In a preferred embodiment of the invention, a method for testing a CPU microprocessor having an internal cache comprises steps of (a) mounting the CPU microprocessor to a test fixture providing signal communication between a testing computer and external pads of the CPU microprocessor; (b) activating a testing program on the test computer; (c) testing one IU of the CPU microprocessor; (d) testing a portion of the internal cache, leaving) a balance untested; (e) loading a cache test routine to the tested portion of internal cache; (f) executing the cache test routine by the tested IU, testing) the untested balance of the internal cache; and (g) testing any additional IUs and circuitry of the CPU microprocessor by the test computer in parallel with step (f).

In some embodiments there may be but one IU on the CPU to be tested, and the advantage lies in the ability of the CPU to test its own cache more rapidly and reliable than can be done by a remote computer, while other connections and circuitry is tested on the CPU. In other embodiments a CPU may have two or more IUs and circuitry in addition to the internal cache, and there is a significant saving in time due to the ability provided to test a large part of the internal cache while at the same time testing all the IUs and circuitry after the first is tested.

In an alternative embodiment of the invention a system is provided for testing CPU microprocessors according to the methods of the invention.

DESCRIPTION OF THE PREFERRED EMBODIMENTS

Figure 1A:
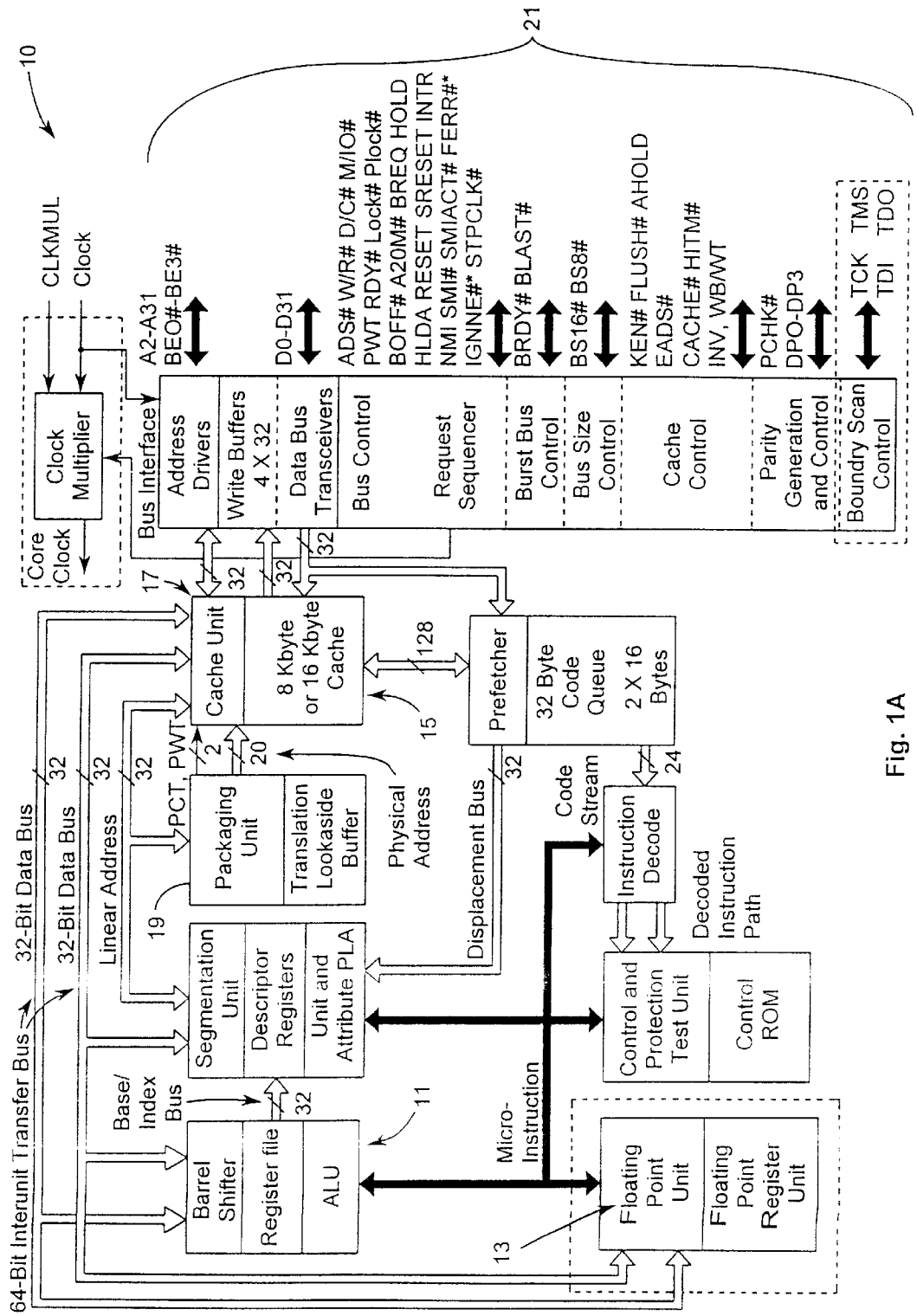
FIG. 1A is a somewhat generalized block diagram of an Intel 486™ CPU microprocessor as known in the art.

FIG. 1A is a somewhat Generalized block diagram of a CPU microprocessor 10 as might be tested in accordance with an embodiment of the present invention. The particular CPU illustrated in FIG. 1A is an Intel 486™ CPU microprocessor as known in the art, reproduced from page 16 of the Intel handbook referenced herein.

Of particular interest in the diagram of FIG. 1A, are an Arithmetic and Logic Unit (ALU) 11 and a Floating Point Unit 13. These units are independently operable instruction units, illustrating that the 486™ CPU is a multiple instruction unit CPU. Also of interest for purposes of the present invention is an internal cache 15, shown as either an 8 kByte or 16 kByte cache. Internal cache unit 17, together with paging unit 19 and some other elements perform cache management.

Interface to the circuits on the CPU of FIG. 1A is illustrated by bus arrow indicators along one side of FIG. 1A, such as D0–D31 (32 leads) illustrated as connecting to data bus transceivers. This interface is generally labeled as interface 21, and consists, for 486™ CPUs of as many as 208 separate pins or leads.

Figure 1B:
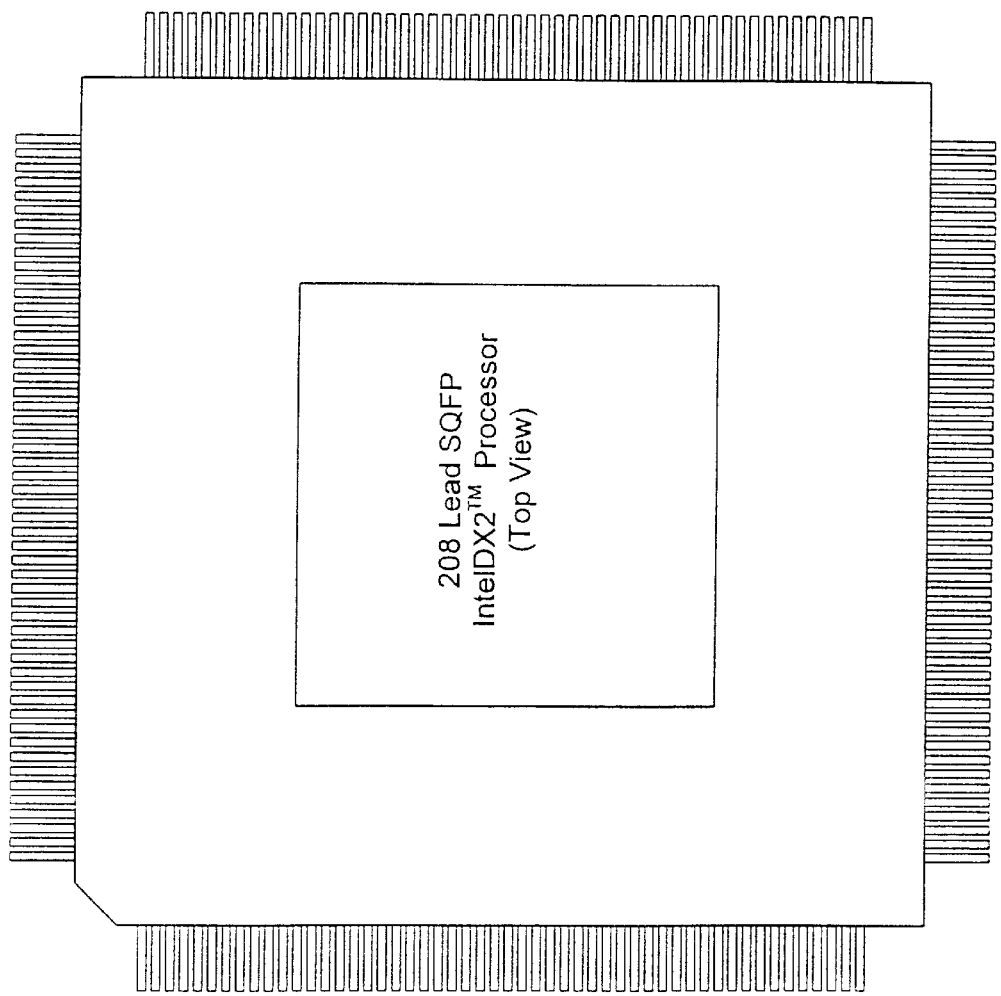
FIG. 1B is a top plan view of a 208-lead SQFP Intel DX2™ Quad Flat Pack processor.

FIG. 1B is a top plan view of a 208-lead SQFP Intel DX2™ Quad Flat Pack processor. The purpose of FIG. 1B is simply to further characterize the nature of and the number of leads requiring connection for interfacing test equipment to a CPU for applying test vectors.

Figure 2:
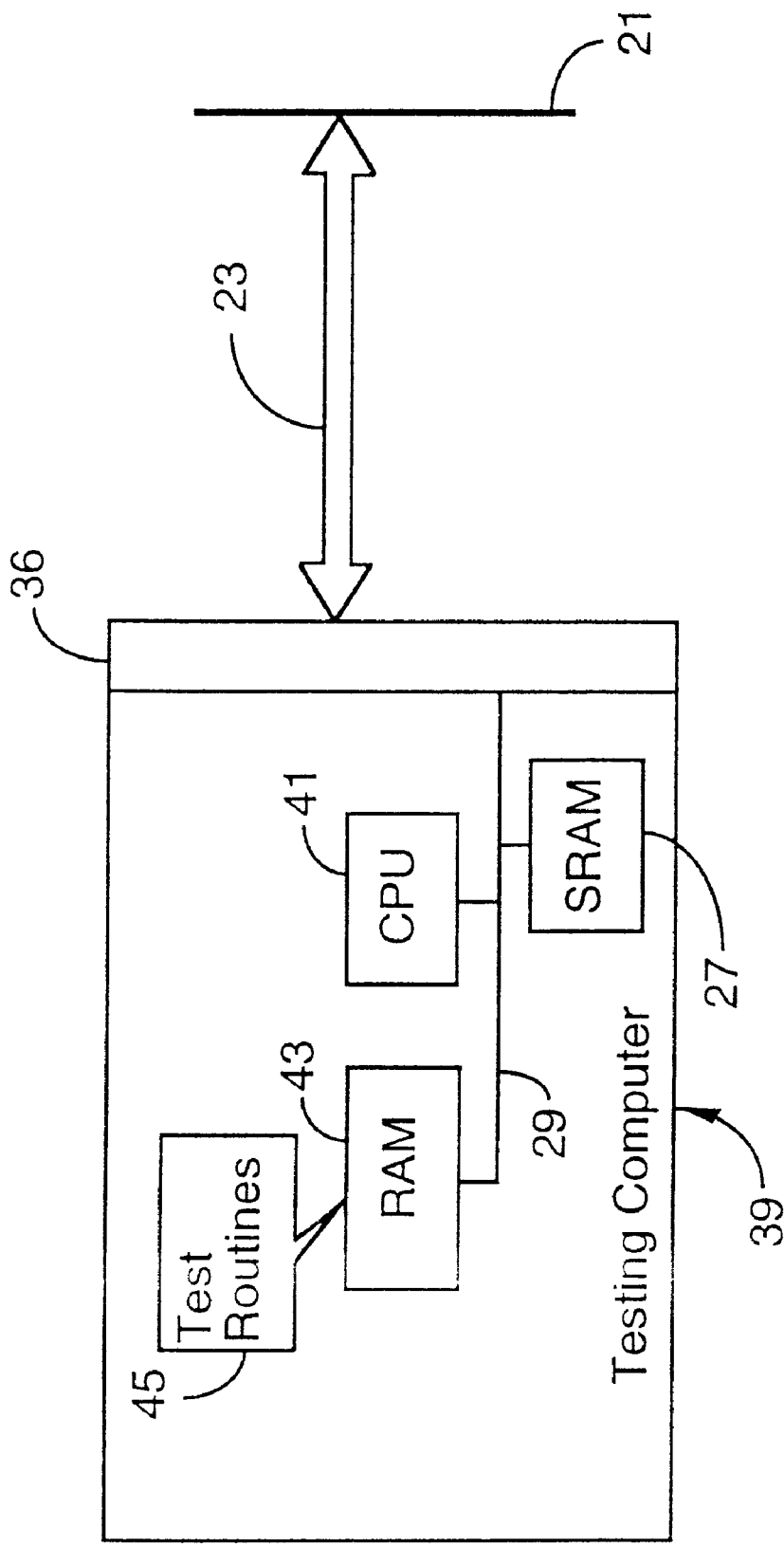
FIG. 2 is a largely schematic block diagram of a testing computer with interface to the CPU microprocessor of FIG. 1A.

FIG. 2 is a largely schematic block, diagram of a testing computer 39 with interface 21 to the CPU microprocessor of FIG. 1A. Interconnecting traces to the test equipment are shown here generally as bus 23 to an I/O interface 36. Of the as many as 208 leads from the CPU of FIGS. 1A and 1B, some are power, some are ground, and some may not be used or may be reserved for some future purpose.

As the Intel 486™ CPU illustrated is exemplary, the interface is meant to be general to many kinds of CPUs that might be subject to test according to embodiments of the present invention.

Testing computer 39 comprises, among, other elements, a CPU 41, a random access memory 43 containing test routines 45 for managing tests of CPUs, the test routines executable by the CPU, a vector buffer 27 of fast SRAM, the I/O interface circuitry 36 introduced above, and an interconnecting bus structure 29. It will be apparent to those with skill in the art that the architecture shown is general in nature, and that there are many equivalent structures that might be used for the purpose.

In conventional practice, the testing computer feeds test vectors via SRAM 27 and interface 36 to a CPU coupled to interface 21 as quickly as practical with physical constraints of hardware and interconnection characteristics. The purpose of the fast SRAM buffer is to make this process as fast as may be accomplished.

Figure 3:
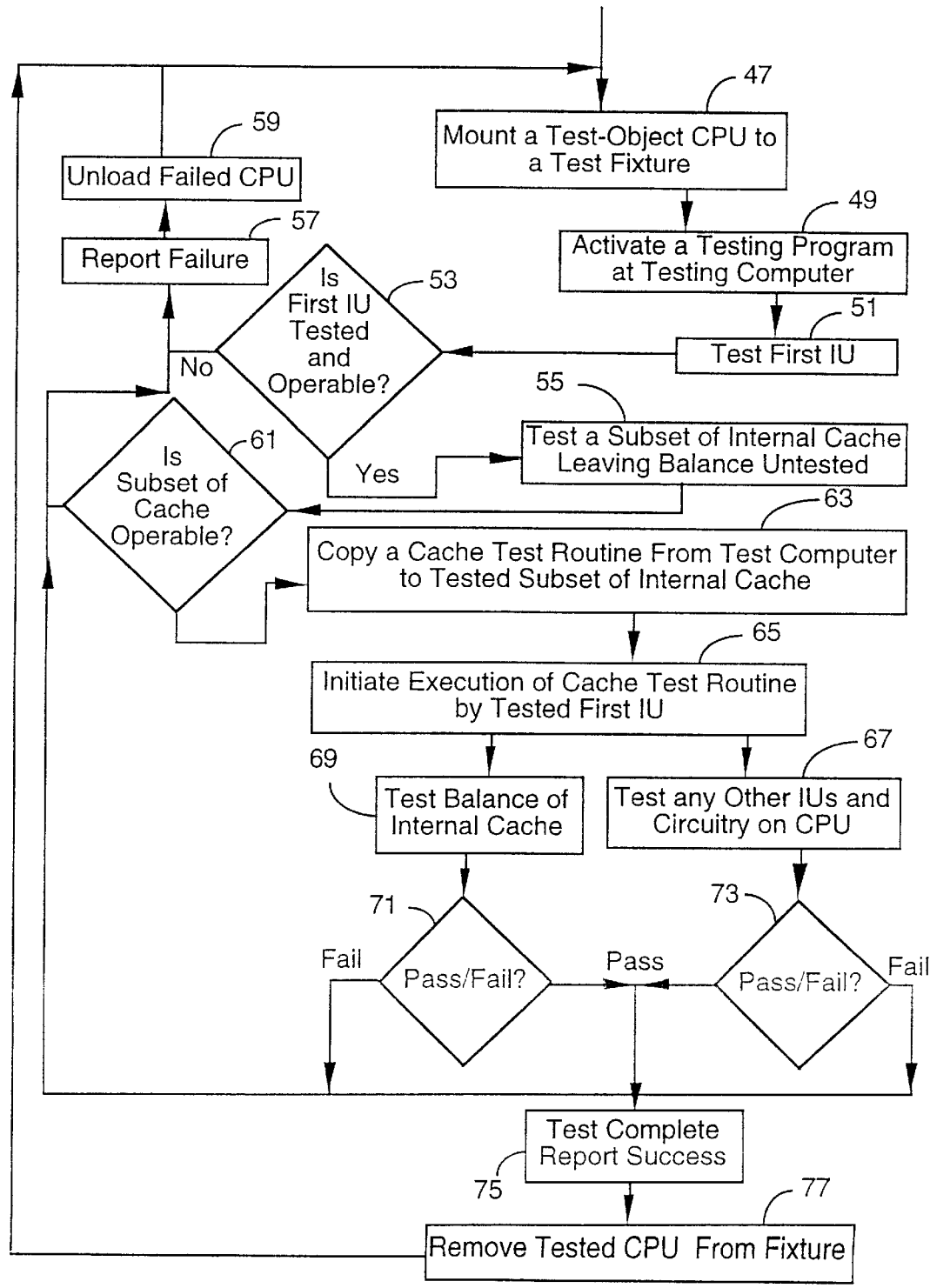
FIG. 3 is a logic flow diagram of step-by-step process for accomplishing testing of a CPU microprocessor according to an embodiment of the present invention.

The present case, however, is not the conventional case. According to an embodiment of the present invention, CPU microprocessor 10 is tested in a procedure according to steps shown in logic flow diagram FIG. 3. Before describing the process steps of FIG. 3 in detail, however, certain requirements of a CPU to be tested need be explained.

In a testing process according to the present invention, a test-object CPU such as CPU 10 of FIG. 1A, is interfaced to testing computer 39, so test vectors may be provided and results monitored. Unique test routines 45 test first a portion of internal cache, such as cache 15, and one Instruction Unit, such as ALU 11. The order of testing of these portions is not critical. That is, the IU can be tested first, or the internal cache portion.

The portion of internal cache tested may vary in size according to the rope and particular design of a test-object CPU. For the example shown, this portion may be about 1 kByte. The purpose of the first-tested cache portion is to subsequently hold an instruction set for the first tested IU to execute, so, the size of the cache portion necessary is determined by the size of the instruction set to be loaded, which may vary for different test-object CPUs.

For a CPU to be testable by an embodiment of the present invention, there is a requirement that the CPU be capable of treating internal cache either as cache memory or as random access memory. This difference is a function of on-chip cache management. Cache control elements need to be adressable from off-chip to switch this mode. There are several ways such an adjustment might be made, which are within the routine ability of those with skill in the art.

Another requirement for a CPU to be testable according to an embodiment of the present invention is that the CPU be capable of assigning execution of a routine in internal cache, treating the internal cache as RAM, to a particular IU. Again, given the requirement, this is within the ability of microprocessor designers with skill in the art.

Returning to FIG. 3 assuming a test-object CPU with ability to lock a test routine into a portion of internal cache, and to treat that portion at least as RAM, and to assign and initiate execution of such a test routine by a specified instruction unit, a CPU test according to an embodiment of the present invention proceeds as follows:

At step 47 a test object CPU microprocessor, that is, a CPU microprocessor to be tested, is interfaced to a test fixture, leads of the test fixture making contact to interface pads of the test object CPU microprocessor, which may be done, as described above, in a number of different ways. The test fixture may be part of an automated or semi-automated machine, and CPUs to be tested may be handled by robotic equipment.

At step 49, with a test object CPU interfaced, a test program is activated on a testing computer (FIG. 3, element 39) having an I/O interface to the test fixture. At step 51 a first IU on the test-object CPU is tested. At step 53, if the first IU is verified as fully tested and operable, control goes to step 55. If this test fails, control goes to step 57, and the failure is reported. At step 59 the failed CPU is removed from the test fixture, and an untested CPU is mounted.

If the first IU tests operable, at step 55 a subset of the internal cache is tested. At step 61, if the subset of internal cache is verified as operable control goes to step 63. If the internal cache fails this subset test, control goes to step 57, where the failure is reported. At step 59 the failed CPU is removed from the test fixture.

At step 63 a cache test routine is copied into the tested subset of cache from the testing computer. This is done by vectors, and is within the skill of those with skill in the art. The purpose of this routine is to provide an instruction set for the already-tested first IU to access and execute, to accomplish testing of the balance of internal cache. At step 65 execution of the cache test routine by the first IU is initiated by the test computer.

Steps 51, 55 and 63 do not have to be performed in exactly the order shown, but all three need be done before step 65. It is also necessary that the subset of cache be tested before the cache test routine is copied from the test computer.

Once execution of the cache test routine stored in the tested subset of internal cache is started, this procedure can proceed external to further operations of testing computer, and the testing computer can in parallel, process vectors to test any other IUs on the test-object CPU. The unique advantage of the apparatus and method of the invention is that a significant portion of testing can be done in parallel, with the cache self-test operating at the same time the testing computer is processing vectors to test and verify other IUs circuitry, and connections on the test-object CPU.

Proceeding from step 63, as stated above, execution of the copied cache test routine is initiated at step 65. At the same time, the testing computer may test further IUs (if any) at step 67, in parallel with testing of the balance of internal cache at step 69.

If failure is encountered at any point in testing the balance of internal cache (step 71), control goes to step 57, where the failure is reported. At step 59 the failed CPU is removed from the test fixture prior to loading another CPU to be tested.

If failure is encountered at any time in the parallel testing of other than the first IU and other circuitry (Step 73), control goes to step 57 as well, failure is reported, and the failed CPU is removed from the test fixture at step 59.

If the balance of internal cache tests operable, and the balance of IUs and circuitry other than the first IU tested also test operable, control goes to step 75 and the test is complete. Success is reported at this point. At step 71 the passed CPU is removed from the test fixture, and the system is then reads for another untested CPU to be loaded to the test fixture at step 47.

It will be apparent to those with skill in the art that there are many variations that might be made in the embodiment described above without departing from the spirit and scope of the invention. Some of these variations have already been described, such as the variable order of some of the steps. It is well-known as well that different programmers may program certain sequences in different ways, accomplishing the same result. As another example of differences within the scope of the invention there is a wide variation in the nature of test fixtures. Some are single station and manually operated, for example, and others have more than one station, and are robotically aided.

What is claimed is:

1. A method for testing an integrated circuit having memory and at least one logic portion capable of executing test routine instructions to be loaded in the memory, comprising steps of:

(a) testing the at least one logic portion and at least a part of the memory, providing thereby a tested logic unit and a tested portion of the memory;

(b) loading test routine instructions to the tested portion of the memory; and (c) executing the test routine instructions by said tested logic portion to test other portions of the integrated circuit.

2. The method of claim 1 wherein the integrated circuit is a CPU microprocessor.

3. The method of claim 2 wherein the at least one logic portion comprises two or more instruction units, and the memory comprises an on-board cache.

4. The method of claim 1 wherein the testing of the at least one logic portion and the portion of the memory, and the loading of the test routine instructions is performed by an external computerized testing system.

5. A testing system for testing an integrated circuit having memory and at least one logic portion capable of executing test routine instructions to be loaded in the memory, comprising:

a test computer; and a test fixture connected to the test computer and adapted for connecting leads of the integrated circuit to the test computer;

wherein the test computer tests the at least one logic portion and a portion of the memory, providing thereby a tested logic unit and a tested portion of the memory loads test routine instructions from the test computer to the tested portion of the memory, and causes the tested logic unit to execute the test routine instructions to test other portions of the integrated circuit.

6. The system of claim 5 wherein the test system has a single testing station.

7. The system of claim 5 wherein the integrated circuit is loaded and unloaded onto the fixture by a robotic equipment.

* * * * *